United States Patent [19]

Wakefield et al.

[11] Patent Number: 4,551,291

[45] Date of Patent: Nov. 5, 1985

[54] SURFACE IMPROVEMENT OF SEMICONDUCTORS IN HIGH SPEED CASTING

[75] Inventors: G. Felix Wakefield, Woodland Hills; David L. Bender; Samuel N. Rea, both of Thousand Oaks, all of Calif.

[73] Assignee: Atlantic Richfield Company, Los Angeles, Calif.

[21] Appl. No.: 540,692

[22] Filed: Oct. 11, 1983

Related U.S. Application Data

[63] Continuation of Ser. No. 391,210, Jun. 23, 1982, abandoned.

[51] Int. Cl.⁴ .............................................. B29D 7/00
[52] U.S. Cl. .................................... 264/104; 264/169; 264/213
[58] Field of Search ............... 264/169, 104, 212, 213, 264/332; 425/68, 104, 224, 447

[56] References Cited

U.S. PATENT DOCUMENTS

| | | | |
|---|---|---|---|
| 1,187,929 | 6/1916 | Reid | 425/224 |
| 2,200,001 | 5/1940 | Kenyon | 264/212 |
| 2,728,952 | 1/1956 | Boroushko | 264/215 |
| 3,023,253 | 2/1962 | Bain | 264/215 |
| 3,032,815 | 5/1962 | Gerber | 425/224 |
| 3,843,762 | 10/1974 | Sleigh | 264/215 |
| 4,088,727 | 5/1978 | Elliott | 264/213 |
| 4,101,624 | 7/1978 | Johnson | 264/273 |
| 4,148,851 | 4/1979 | Tani et al. | 264/213 |
| 4,262,732 | 4/1981 | Ramoni | 264/215 |

OTHER PUBLICATIONS

Handbook of Chemistry and Physics, Weast, 64th Ed., 1983, p. B-31.
The Condensed Chemical Dictionary, 10th Ed., Van Nostrand Reinhold Co., 1981.

*Primary Examiner*—Donald Czaja
*Assistant Examiner*—V. Fischbach
*Attorney, Agent, or Firm*—Albert C. Metrailer

[57] ABSTRACT

Apparatus and method for producing semiconductor ribbon directly from the molten state by contact with a moving chill surface wherein water vapor is introduced to improve ribbon top surface smoothness.

7 Claims, 1 Drawing Figure

U.S. Patent Nov. 5, 1985 4,551,291
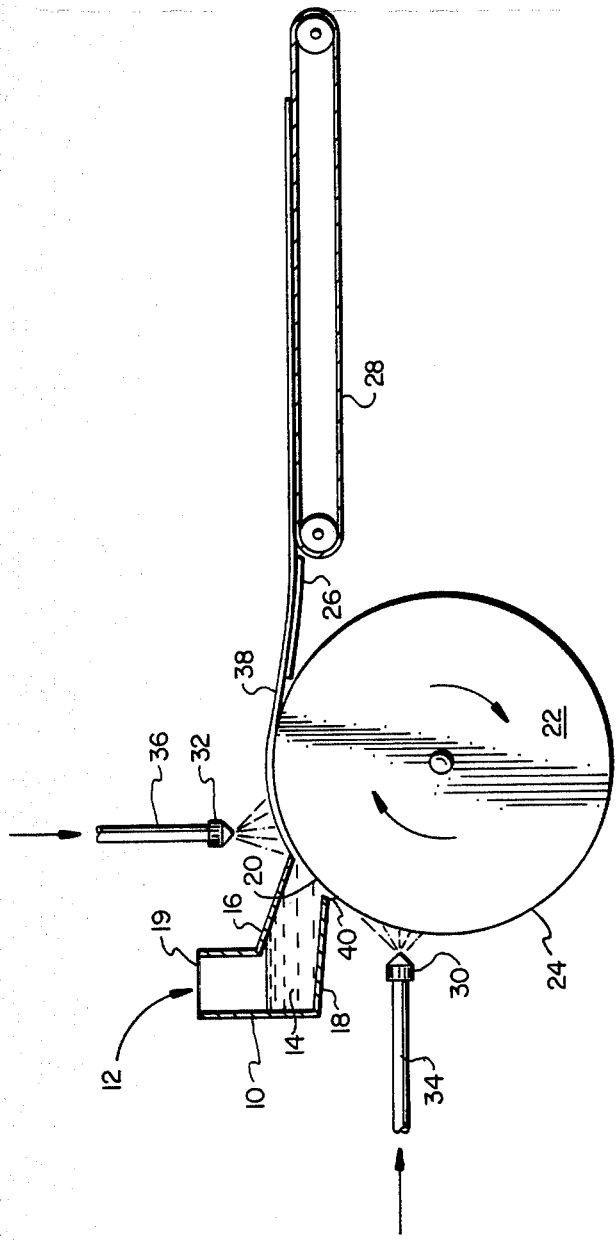

SURFACE IMPROVEMENT OF SEMICONDUCTORS IN HIGH SPEED CASTING

This application is a continuation of application Ser. No. 391,210, filed June 23, 1982, now abandoned.

BACKGROUND OF THE INVENTION

The present invention relates to methods and apparatus for the production of semiconductor ribbons from a melt and more particularly to improved apparatus and methods in which surface smoothness is improved by use of water vapor.

A reference known to the Applicants and believed to be relevant to the present invention is U.S. Pat. No. 3,605,863 issued to King on Sept. 20, 1971. This patent is hereby incorporated by reference for its teaching of apparatus and methods for formation of ribbon materials which are generally applicable to formation of semiconductor ribbons.

It is generally recognized that a major portion of the cost of production of photovoltaic solar cells is the cost of the original high purity silicon and its preparation into wafers of suitable size and shape. A standard process involves the growing of monocrystalline boules using the Czochralski technique and then mechanically sawing the boules into thin slices or wafers. Half of the original silicon material is typically lost in the sawing process. Photovoltaic cells have also been made from polycrystalline silicon after it was poured into essentially brick-shaped molds and then sawed into square slices. While such processing of polycrystalline material is less expensive than growth of single crystal material, the resulting cells have lower efficiency and essentially half of the material is still lost in the sawing process. Much effort has, therefore, been made to develop apparatus and techniques for producing wafers or ribbons of silicon directly from the molten state. The above-referenced King patent illustrates one type of apparatus which has resulted from such efforts.

The basic method illustrated by the King patent includes the contacting of a molten body of material with the surface of a moving drum or wheel. The surface of the wheel is cool relative to the molten mass and by cooling a portion thereof, pulls or drags off a film or ribbon of the material in a solidified form. In applying this type of technology to semiconductor materials, we have found that the ribbon produced generally has a very rough upper surface. The roughness is generally in the form of discrete bumps which interfere with or prohibit processing of the materials into photovoltaic cells. While it is possible to grind or polish the upper surface to a suitable smoothness, such additional operations defeat the cost reduction advantages of the ribbon methods.

SUMMARY OF THE INVENTION

Accordingly, an object of the present invention is to provide improved apparatus for producing semiconductor ribbon materials.

Another object of the present invention is to provide methods for producing semiconductor ribbon materials having smooth surface suitable for processing into photovoltaic cells.

Apparatus according to the present invention includes means for contacting a molten mass of semiconductor material with a moving chill surface and for providing an atmosphere containing water vapor in the region where said molten mass contacts said chill surface. In one form, either water mist or steam is sprayed directly onto the chill surface before it contacts the molten mass of semiconductor material. In another form, a water mist or steam is directed at the molten semiconductor material at the point of contact with the chill surface. In another form, the water is applied at both locations.

BRIEF DESCRIPTION OF THE DRAWING

The present invention may be better understood by reading the following detailed description of the preferred embodiments with reference to the accompanying drawing which illustrates a semiconductor ribbon growth machine according to the present invention.

DESCRIPTION OF THE PREFERRED EMBODIMENT

With reference now to the FIGURE, there is illustrated a semiconductor ribbon growth apparatus according to the present invention. The apparatus includes a closed tundish 10 formed from quartz plates. Tundish 10 has an upper opening 12 into which molten silicon may be continuously poured to maintain a body of molten silicon 14. Upper and lower quartz plates 16 and 18 and side plates 19 (only one shown) form a narrow opening 20 adjacent a rotating cooled wheel 22. At least the outer surface 24 of wheel 22 is formed from a relatively high melting temperature material such as stainless steel or copper. The wheel 22 is supplied with means for rotating in the direction indicated and for cooling the wheel to an appropriate operating temperature range by means well known in the art as illustrated by the above-referenced King patent. A scraper 26 is provided opposite tundish 10 for lifting ribbon material from wheel 22 and directing it to a conveyor belt or system 28 for collection and cooling.

Also illustrated in the FIGURE are a pair of nozzles 30 and 32. Nozzles 30 and 32 are each connected to a conduit 34 and 36 respectively through which some form of water or steam is supplied under pressure to the nozzles. Nozzle 30 is positioned below tundish 10 and directed toward the surface 24 of rotating wheel 22 to spray water or steam on the wheel surface before it reaches the silicon contact point at opening 20. Nozzle 32 is positioned generally above tundish 10 and directed to spray water or steam onto the tundish essentially at the point where the molten body of silicon 14 contacts the surface 24 of wheel 22.

In operation, the wheel 22 is rotated while molten silicon is poured at a controlled rate into opening 12 to form the body of molten silicon 14 in tundish 10. Upon contact of molten silicon with the wheel surface 24 at opening 20, a thin layer of silicon solidifies on the wheel forming a ribbon 38. The ribbon 38 is lifted from the wheel by the scraper 26 as the wheel rotates and directed to the conveyor system 28 where it is collected and cooled.

It is generally understood that operation of the system as above-described should normally take place in a nonreactive atmosphere. Both primary components of air, nitrogen and oxygen, are reactive with molten silicon and must therefore be excluded from the ribbon production zone. Various heating elements must be operated within the zone to maintain silicon in the molten state and these heaters are also quite reactive with oxygen at these elevated temperatures. Various contaminants in air also act as doping agents and would modify the electrical characteristics of the silicon if allowed to contact it while in a molten state. For these reasons it is conventional practice to operate the system within an argon-filled closed chamber providing only a small opening for ribbon material 38 to exit and be collected on the conveyor system 28. However, we have discovered that by addition of water vapor to the argon atmosphere, the upper surface finish of ribbon 38 is dramatically improved. Although the water vapor generates an oxide layer on the silicon ribbon, the oxide is easily removed by chemical means to leave a smooth, shiny ribbon surface suitable for conventional solar cell processing.

As used herein, the term water generally refers to distilled water which was used in experimental runs. While actual distillation may not be necessary, most commonly available water, e.g. tap water, would have to be treated for removal of undesirable dissolved or suspended materials before use.

Water was introduced into the system at one or both of the locations indicated by nozzles 30 and 32 using several different methods. Steam was supplied to the nozzles and sprayed on either the wheel or the ribbon 38. Water was also aspirated by argon and sprayed on at the same locations. The simplest and preferred method is the use of water under pressure supplied to nozzles 30 and 32 designed to break the water into a fine mist. All methods of introduction resulted in dramatic improvement in ribbon surface properties. The use of nozzle 32, especially with liquid water, has a tendency to overcool the molten silicon 14 and cause it to solidify in tundish 10 which obviously interrupts further operation of the system. We have found that equally good or better results can be obtained by using only nozzle 30 and the simplest water supply method, that is pure water sprayed through a mist nozzle directly onto the wheel surface 24. In the preferred arrangement, any liquid water which reaches wheel surface 24 is evaporated before it reaches the opening 20 where contact with molten silicon is made. The resulting water vapor or steam is carried into and around the silicon contact zone and very effectively improves the ribbon quality.

We have found that injection of water mist or steam at almost any point within the argon filled chamber significantly improves surface quality. The specific nozzle positions discussed above were found more effective and are therefore preferred.

There is a small meniscus 40 of molten silicon between the edge of lower tundish plate 18 and the outer surface 24 of wheel 22. By use of the preferred method of spraying a fine water mist through nozzle 30 onto wheel 22, we believe that some oxidation of silicon at the meniscus 40 occurs and may be responsible for overall improvement of ribbon quality by this process.

We have not determined the exact mechanism by which the use of water vapor improves surface characteristics of silicon ribbon in our process. However, we believe that the oxide layer which results from the water vapor tends to modify the surface tension and cooling rate of the material. The modification apparently minimizes variations in the solidification or ribbon formation rates and we believe that this helps to eliminate surface variations. We also believe that formation of an oxide layer on the meniscus 40 results in an oxide layer between the silicon ribbon and wheel surface 24 which may be beneficial. This oxide layer may slow the transfer of heat from ribbon 38 to the wheel 22 and may possibly provide nucleation sites which enhance the growth of larger crystal grains in the ribbon 38. Various experimental runs have shown that crystal grain size tends to be larger when water vapor is used in the system.

In all experimental ribbon production runs, the wheel 22 had a diameter of 31 inches and a width of 2 inches. In a typical run, a charge of 4.0 kg of virgin silicon doped with 1.6 gms of boron was melted at a temperature of 1575° C. The tundish 10 was maintained at a temperature of 1525° C. Wheel 22 had a smooth stainless steel surface 24 and was rotated at a rate of 2.7 rpm. Silicon was poured into the tundish 10 at a rate of 165 gms per minute for 24.2 minutes. A mist of water was sprayed onto the wheel 22 through nozzle 30 at a rate of from one to two pounds per hour. The resulting ribbon had a smooth upper surface and a thickness of between 0.010 inch and 0.018 inch. The ribbon had large crystal grains measuring up to 0.250 inches. Another run under essentially the same conditions, except that the silicon flow rate was 232 gms per minute for 17.2 minutes and water mist was provided from both nozzles 30 and 32 at rates of from one to two pounds per hour, resulted in the production of high quality smooth silicon ribbon also.

We have found generally that the amount of water spray in the system may be varied considerably with good results. Some improvement appears to be obtained with increases in the amount of water spray. In general, the upper limit on the amount of water spray is based upon the amount of cooling which can be tolerated without causing freezing of the silicon in the tundish itself.

While the above description is concerned primarily with smoothness of the upper or outer surface of the produced silicon ribbon, it is, of course, understood that the lower ribbon surface, that is the surface which contacts surface 24 of wheel 22, should also be smooth to allow processing of the resulting material into photovoltaic cells. Smoothness of the lower surface is generally no problem since that surface conforms to the surface of wheel 22 and the wheel can be easily ground and polished to an appropriate finish.

While the above described embodiments involve the use of a rotating wheel or drum, other moving chill surfaces may be employed. For example, other ribbon casting equipment has used a continuous metal belt running on cooled rollers or drums as the chill surface to which molten metal is contacted. The water injection equipment and techniques taught herein should be beneficial in such systems also.

While the present invention has been illustrated and described with respect to particular apparatus and methods of operations, it is understood that various modifications and changes can be made therein within the scope of the invention as defined by the appended claims.

We claim:

1. In a method of producing semiconductor ribbon material in which a body of molten semiconductor material is brought into contact with a moving chill surface in a substantially inert atmosphere;

the improvement comprising injecting water vapor into said substantially inert atmosphere, whereby surface smoothness of produced ribbon is improved.

2. A method for producing solid silicon ribbon material comprising:

contacting a body of molten silicon with a moving chill surface in an atmosphere comprising primarily an inert gas, said atmosphere surrounding said molten silicon at least at the point of contact with said chill surface, and simultaneously injecting water vapor into at least that portion of said atmosphere surrounding said silicon at said point of contact with said chill surface.

3. A method according to claim 2, wherein said moving chill surface is maintained at a temperature substantially above the boiling point of water and said water vapor is provided by spraying a mist of water on said chill surface adjacent said point of contact, wherein the quantity of water mist is selected to provide no significant cooling of said chill surface.

4. A method according to claim 2 wherein said water vapor is provided by spraying a mist of water on said molten silicon at said point of contact, wherein the quantity of water mist is selected to provide no significant cooling of said molten silicon.

5. A method according to claim 2 wherein said water vapor is provided by spraying steam into at least that portion of said atmosphere surrounding said molten silicon at the point of contact with said moving chill surface.

6. A method according to claim 2 wherein said atmosphere is contained in a closed chamber surrounding said body of molten silicon and said moving chill surface, said atmosphere is maintained by flowing an inert gas into said chamber, and said water vapor is provided by aspirating liquid water with the flow of inert gas.

7. A method according to claim 6 wherein said inert gas is argon.

* * * * *